(12) United States Patent
Ainspan et al.

(10) Patent No.: US 9,225,348 B2
(45) Date of Patent: Dec. 29, 2015

(54) PREDICTION BASED DIGITAL CONTROL FOR FRACTIONAL-N PLLS

(71) Applicant: INTERNATIONAL BUSINESS MACHINES CORPORATION, Armonk, NY (US)

(72) Inventors: Herschel A. Ainspan, New Hempstead, NY (US); Mark A. Ferriss, Tarrytown, NY (US); Daniel J. Friedman, Sleepy Hollow, NY (US); Alexander V. Rylyakov, Mount Kisco, NY (US); Bodhisatwa Sadhu, White Plains, NY (US); Alberto Valdes Garcia, Hartsdale, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/496,643

(22) Filed: Sep. 25, 2014

(65) Prior Publication Data

US 2015/0200676 A1 Jul. 16, 2015

Related U.S. Application Data

(60) Provisional application No. 61/926,028, filed on Jan. 10, 2014.

(51) Int. Cl.
*H03L 7/06* (2006.01)
*H03L 7/099* (2006.01)
*H03L 7/085* (2006.01)
*H03L 7/197* (2006.01)

(52) U.S. Cl.
CPC .............. *H03L 7/0992* (2013.01); *H03L 7/085* (2013.01); *H03L 7/1974* (2013.01)

(58) Field of Classification Search
USPC .................................. 327/147–149, 156–159
See application file for complete search history.

(56) References Cited

U.S. PATENT DOCUMENTS

| 5,038,117 | A | 8/1991 | Miller |
| 5,162,723 | A | 11/1992 | Marzalek et al. |
| 6,259,389 | B1 * | 7/2001 | McGrath ....................... 341/120 |
| 7,605,665 | B2 | 10/2009 | Chambers et al. |
| 7,755,443 | B2 | 7/2010 | Osman et al. |
| 8,396,096 | B2 | 3/2013 | Noel et al. |

(Continued)

FOREIGN PATENT DOCUMENTS

| EP | 1164701 A2 | 12/2001 |
| JP | 2007124267 A | 5/2007 |

(Continued)

OTHER PUBLICATIONS

"List of IBM Patents or Patent Applications Treated as Related".
Curtin, M., et al. "Phase-Locked Loops for High-Frequency Receivers and Transmitters—Part 1" Analog Dialogue. Mar. 1999. vol. 33. No. 3. pp. 1-14.

(Continued)

*Primary Examiner* — Adam Houston
(74) *Attorney, Agent, or Firm* — Tutunjian & Bitetto, P.C.; Anne V. Dougherty

(57) ABSTRACT

Methods and systems for phase correction include determining a phase error direction and generating a prediction for the phase error based on a sigma-delta error. It is determined whether the prediction agrees with the determined phase error direction. If the prediction does not agree, a phase correction is adjusted in accordance with the predicted phase error.

19 Claims, 4 Drawing Sheets

(56) References Cited

U.S. PATENT DOCUMENTS

| | | | |
|---|---|---|---|
| 8,536,916 B1* | 9/2013 | van Engelen et al. | 327/159 |
| 2007/0002993 A1 | 1/2007 | Wang et al. | |
| 2007/0075759 A1* | 4/2007 | Metz et al. | 327/158 |
| 2008/0315959 A1* | 12/2008 | Zhuang et al. | 331/17 |
| 2009/0174491 A1* | 7/2009 | Wang et al. | 331/1 A |
| 2009/0184773 A1* | 7/2009 | Woo et al. | 331/1 R |
| 2009/0206941 A1* | 8/2009 | Wang et al. | 332/119 |
| 2010/0097150 A1* | 4/2010 | Ueda et al. | 331/25 |
| 2010/0123488 A1 | 5/2010 | Palmer et al. | |
| 2010/0188158 A1 | 7/2010 | Ainspan et al. | |
| 2012/0139587 A1 | 6/2012 | Drago et al. | |
| 2012/0242383 A1 | 9/2012 | Elad et al. | |
| 2013/0009679 A1 | 1/2013 | Sindalovsky et al. | |
| 2013/0271186 A1 | 10/2013 | Hossain et al. | |
| 2014/0070856 A1* | 3/2014 | Ainspan et al. | 327/145 |
| 2014/0191787 A1* | 7/2014 | Xing et al. | 327/157 |
| 2015/0015308 A1* | 1/2015 | Da Dalt | 327/106 |
| 2015/0200676 A1* | 7/2015 | Ainspan et al. | 327/159 |

FOREIGN PATENT DOCUMENTS

| | | |
|---|---|---|
| WO | WO 00/21197 A1 | 4/2000 |
| WO | WO 2010/056840 A1 | 5/2010 |

OTHER PUBLICATIONS

Ferriss, M. et al. "A 28GHZ Hybrid PLL in 32nm SOI CMOS" Jun. 2013. pp. 1-2.

Huang, D., "A Fast-Locked All-Digital Phased-Locked Loop Using Successive—Approximation Frequency-Search Algorithm" Apr. 2012.

Lee, I., "A 4.8-GHz Dividerless Subharmonically Injection-Locked All-Digital PLL With a Fom of -252.5 DB" IEEE Transactions on Circuits and Systems-II: Express Briefs. Feb. 2013. pp. 1-5.

Obote, S., et al. "Novel Fractional-N PLL Frequency Synthesizer With Reduced Phase Error" IEEE Asia Pacific Conference on Circuits and Systems. Nov. 1996. pp. 45-48.

Perrott, M., "A Modeling Approach for_-_Fractional-N Frequency Synthesizers Allowing Straightforward Noise Analysis" IEEE Journal of Solid- State Circuits. Aug. 2002. vol. 37. No. 8. pp. 1028-1038.

Sadhu, B., et al. "A Linearized, Low-Phase-Noise VCO-Based 25-GHz PLL With Autonomic Biasing" IEEE Journal of Solid-State Circuits. May 2013. vol. 48. No. 5. pp. 1138-1150.

Straayer, M., "A Multi-Path Gated Ring Oscillator TDC With First-Order Noise Shaping" IEEE Journal of Solid-State Circuits. Apr. 2009. Vol. 44, No. 4. pp. 1089-1098.

* cited by examiner

PREDICTION BASED DIGITAL CONTROL FOR FRACTIONAL-N PLLS

CROSS REFERENCE TO RELATED APPLICATIONS

This application is claims priority to provisional application Ser. No. 61/926,028 filed Jan. 10, 2014, incorporated herein by reference in its entirety.

STATEMENT REGARDING FEDERALLY SPONSORED RESEARCH OR DEVELOPMENT

This invention was made with Government support under Contract No.: HR0011-12-C-0087 (Defense Advanced Research Projects Agency (DARPA)). The Government has certain rights to this invention.

BACKGROUND

1. Technical Field

The present invention relates to phase locked loops and, more particularly, to a prediction-based control scheme for a digital control path of a fractional-N phase locked loop.

2. Description of the Related Art

Phase locked loops (PLLs) are components in many systems, e.g., microprocessors, millimeter-wave radios, and serial links. Digital PLLs may be used wherever reducing the power and area requirements of the PLL is important. One type of PLL that has been difficult to transition to digital is the fractional-N PLL. A fractional-N PLL is a PLL which generates an output frequency having a non-integer or fractional ratio to the input reference frequency. A fractional-N PLL typically achieves this by modulating the division ration of the PLL's feedback divider in integer steps, so as to achieve an average fractional (non-integer) net division ration.

Conventional analog fractional-N PLLs use linear charge pumps and analog loop filters. The large capacitor in the loop filter is relatively expensive. Furthermore, conventional bang-bang digital PLLs do not work well in fractional-N mode. As a result of the non-linearity of the bang-bang phase detector, the output phase noise is corrupted. Very fast reference rates are needed for such digital PLLs to achieve even moderate performance.

SUMMARY

A fractional-N digital phase-locked loop (PLL) includes a bang-bang phase frequency detector that is configured to output an early/late signal based on a reference signal and a feedback signal. A prediction module is configured to generate a predicted phase error based on a sigma-delta error and to output a phase error correction if the predicted phase error disagrees with the early/late signal. A digitally controlled oscillator (DCO), is configured to output a phase-corrected multiple of the reference signal based on the reference signal and the output of the prediction module. An integer divider is configured to divide in frequency the output of the digitally controlled oscillator by an integer value N. A sigma-delta module is configured to change the integer value N in accordance with a non-integer divide ratio.

A fractional-N hybrid PLL includes a bang-bang phase frequency detector that is configured to output an early/late signal based on a reference signal and a feedback signal. A prediction module is configured to generate a predicted phase error based on a sigma-delta error and to output a phase error correction if the predicted phase error disagrees with the early/late signal. A voltage/digitally controlled oscillator (V/DCO) is configured to output a phase-corrected multiple of the reference signal based on the reference signal, the output of the prediction module, and an analog output of the phase frequency detector. An integer divider is configured to divide in frequency the output of the digitally controlled oscillator by an integer value N. A sigma-delta module is configured to change the integer value N in accordance with a non-integer divide ratio.

A method for phase correction includes determining a phase error direction. A prediction for the phase error is generated based on a sigma-delta error. It is determined whether the prediction agrees with the determined phase error direction and, if the prediction does not agree, a phase correction is adjusted in accordance with the predicted phase error.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Embodiments of the present invention provide a prediction-based scheme for controlling a high performance, low noise, bang-bang phase-frequency detector (PFD) based fractional-N phase locked loop (PLL). This allows the PLL to lock much faster than an integer-N bang-bang PLL. In this control scheme, the equivalent gain of the PFD is much larger when the PLL is not locked and decreases when locked.

Figure 1:
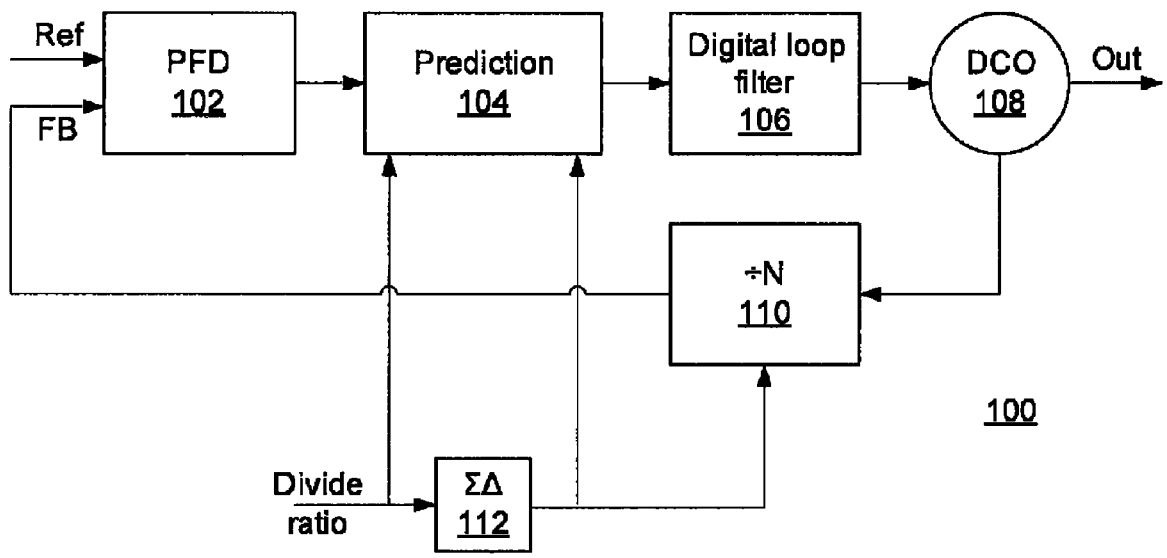
FIG. 1 is a block diagram of a bang-bang digital fractional-N phase-locked loop with a phase error prediction module in accordance with the present principles.

Referring now to the drawings in which like numerals represent the same or similar elements and initially to FIG. 1, a fractional-N digital bang-bang PLL 100 is shown. A bang-bang PFD 102 accepts a reference signal and a feedback signal and outputs a single-bit early/late signal that indicates whether the feedback signal arrived before or after the reference signal. This early/late signal is provided to a prediction module 104, described in greater detail below, the output of which passes through a digital loop filter 106 to control a digitally controlled oscillator (DCO) 108. The DCO 108 provides two outputs, one of which is used in subsequent processes and one of which passes to divider 110, which divides the output by an integer N and creates the feedback input to PFD 102. A sigma-delta module 112 controls the divider 110 according to a divide ratio input.

In a digital PLL 100, the DCO 108 may provide an arbitrary multiple of the reference signal frequency as an output. This allows a single, fixed reference signal to be used to generate multiple different clock signals. To keep the PLL locked, the output signal frequency is divided with divider 110. In many scenarios it is desirable for the DCO 108 to generate an output signal with a frequency which is an arbitrary multiple of the reference signal, a feature which is impossible with a simple integer-N PLL. In the context of the PLL, the output frequency generated will be the frequency of the input reference, multiplied by the average divide ratio of the feedback divider. It is relatively difficult to create a programmable divider that can divide by an arbitrary, non-integer value.

Instead of implementing a non-integer divider, a controllable integer divider 110 is used and the value of the division is changed such that an average division value corresponds to the desired divide ratio. The divider 110 divides the output signal by a value N that is set by the sigma-delta module 112. The sigma-delta module 112 changes N in accordance with the divide ratio. For example, if a divide ratio of 5.5 is specified, the sigma-delta module 112 may provide alternating values of 5 and 6, such that the averaged value of the divider 110 corresponds with the divide ratio.

Figure 2:
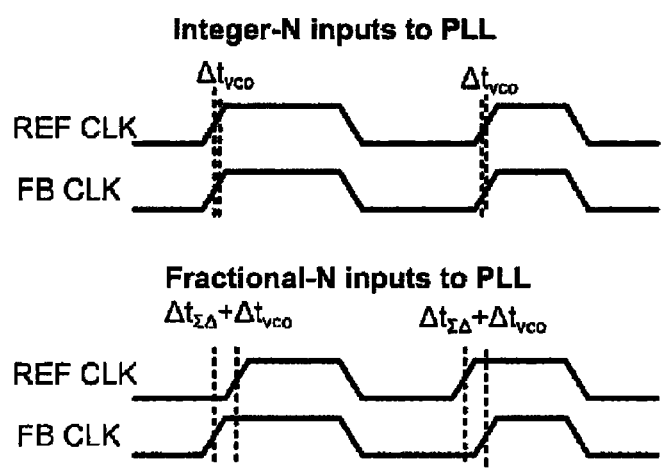
FIG. 2 is a diagram comparing phase errors in integer-N PLLs and fractional-N PLLs.

Referring now to FIG. 2, an exemplary comparison of a reference signal (REF CLK) and a feedback signal (FB CLK) is shown. The respective signals are shown and their respective phases are determined in accordance with the waveforms' leading edge. The top waveform shows an integer-N PLL where the feedback signal's phase stays relatively close to the reference clock. In the fractional-N PLL, however, the reference signal produces a consistent phase while the feedback signal's phase changes frequently as a result of the sigma-delta module 112 changing N. Whereas in an integer-N PLL, the phase deviations are generally small, resulting from oscillator noise, reference noise, and the like, the fractional-N PLL 100 produces large phase variations on top of the noise. Without some form of compensation, the early/late signal from the bang-bang PFD 102 is dominated by sigma-delta noise instead of PLL phase error.

Although the phase error generated by the sigma-delta module 112 is large compared to the phase noise the PLL 100 corrects for, the sigma-delta error is predictable. As a result, there will be times in the cycle when the sigma-delta error may be relatively small, such that the early/late signal may be relied on as being a function of other PLL noise sources. In other words, not all phase measurements in fractional-N digital bang-bang PLL 100 should be treated equally—some measurements will provide more information about the phase state of the PLL 100 than others. The prediction module 104 of the present embodiments interprets the outputs of the PFD 102 to reject the effects of the deterministic errors added by the sigma-delta module 112 and allow the detection of phase errors.

Figure 3:
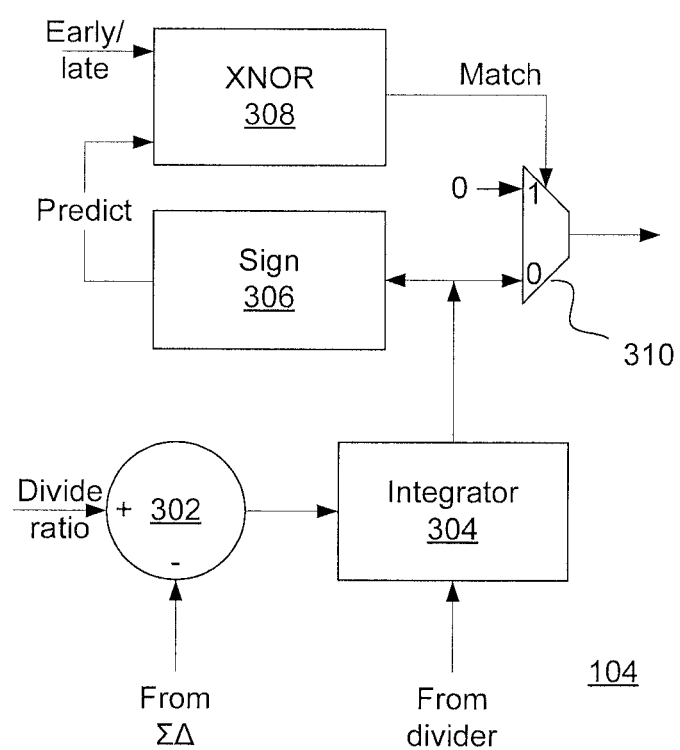
FIG. 3 is a block diagram of a phase error prediction module in accordance with the present principles.

Referring now to FIG. 3, a detailed view of prediction module 104 is shown. A subtractor 302 accepts the divide ratio as a positive input and the output of the sigma-delta module as a negative input. The combiner 302 thereby outputs the difference between the static (average) divide ratio and the current N as an instantaneous frequency error. This difference is provided to integrator 304. The integrator 304 is lossy, such that it removes DC components of the sum. If the integrator were lossless, the start-up conditions of the sigma-delta module 112 and the integrator could introduce errors that are never removed. The lossy integrator 304 is equivalent to a digital Infinite-Impulse-Response filter that has an associated real pole having a magnitude of less than one.

For example, a sigma-delta error sequence of 1, −1, 1, −1 . . . would integrate to 1, 0, 1, 0, etc. This produces a mean value of 0.5, but the actual PLL mean phase error would be zero. The actual phase error sequence should therefore be 0.5, −0.5, 0.5, −0.5, etc. The standard z-domain transfer function of the integrator 304 removes the DC component and may be expressed as $$\frac{z^{-1}}{1-az^{-1}}.$$

In a lossless integrator, a=1. To remove the DC component from the integrator, a is set to less than one (e.g. 0.99), such that the pole associated with the filter is moved to just inside the unit circle. In z-domain analysis, a digital filter such as that described in the above equation has a response to a step function (u[n], where n is a sample number) of $u[n-1]a^{n-1}$. Consequently, when "a" is real and less than one, for large n, $a^n \to 0$.

The sign of the output of the integrator is determined at block 306 and used as an input to XNOR logic 308. The XNOR 308 also receives the early/late output from the bang-bang PFD 102. XNOR 308 outputs a 1 if the predicted sign agrees with the actual PFD determination (e.g., if the inputs are both zero or both one) and outputs a zero if there is a disagreement. The output of the XNOR 308 is used as a control signal to a multiplexer 310, which receives the output of the integrator 304 as one input and a constant zero value as a second input. If the output of XNOR 308 is a logical one (indicating agreement), then knowledge of the phase error generated by the sigma-delta module 112 is sufficient to correctly predict the result from the phase detector. A zero is selected for the output, indicating that no update is to be made the VCO frequency. If the output of the XNOR 308 is a logical zero (indicating disagreement), then the phase error in the actual PLL is as big as or bigger than the phase error due to the sigma-delta module 112. Both the polarity of the PLL's phase error and a one sided bound on its magnitude can be determined using this information. In other words, the PLL's phase error must be at least as big as the output of the integrator 304. Consequently, the output of the integrator 304 is selected as the output of multiplexer 310.

If at any time the prediction fails to agree with the bang-bang PFD output, then the prediction failure is caused by a phase error in the PLL larger than the deterministic sigma-delta induced phase error. This allows the control to the DCO 108 to adjust the phase correction in accordance with the full phase error. This proportional phase control is a significant distinction from conventional bang-bang based PLLs. Because a conventional bang-bang PFD provides no information regarding the magnitude of the phase error, conventional bang-based PLLs are generally limited to incremental phase corrections. In contrast, the present embodiments can correct for large amounts of phase error at a time and automatically changes the magnitude of the correction to correspond to the magnitude of the measured phase error. This allows for rapid locking. Far from the lock, the PFD output will rarely be predicted by the sigma-delta noise, and relatively large changes will be made to the phase error correction. Once phase lock is obtained, phase correction changes will be made when the sigma-delta error is small enough for the actual phase noise of the circuit to dominate.

Figure 4:
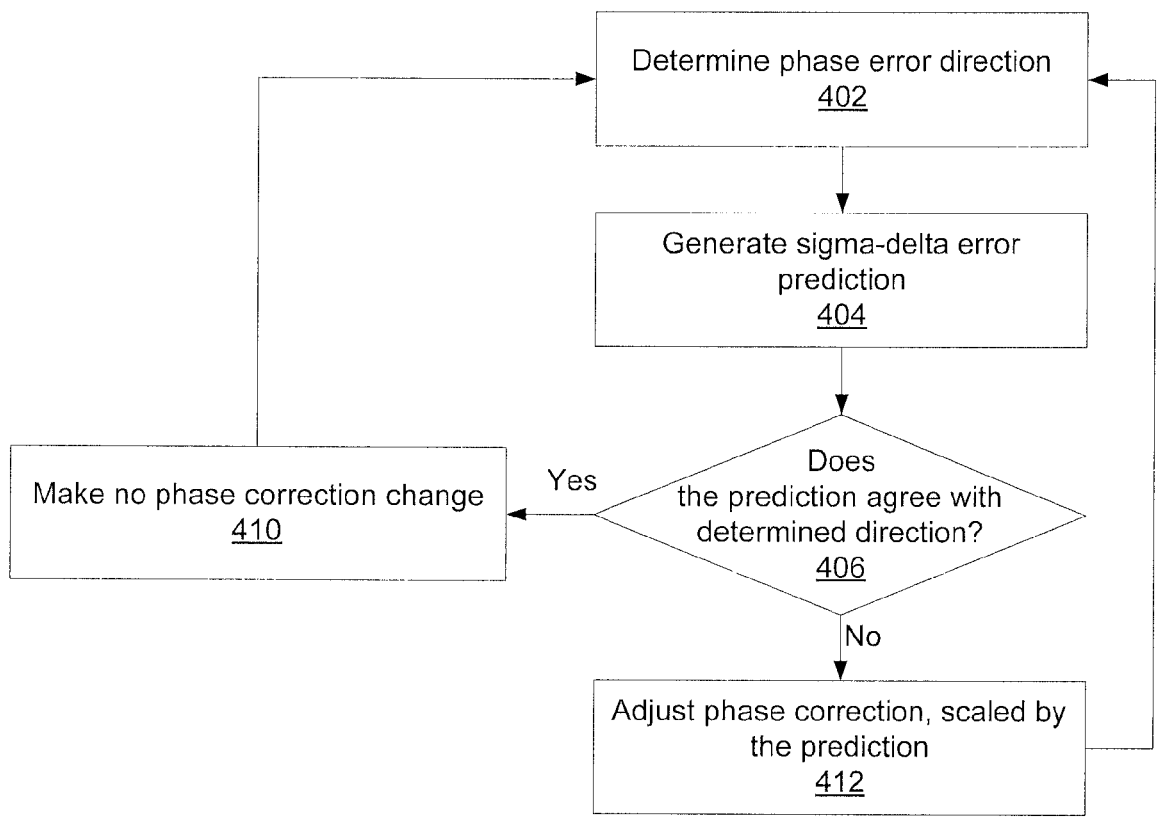
FIG. 4 is a method of phase error correction in accordance with the present principles.

Referring now to FIG. 4, a method for phase error correction in a fractional-N digital PLL is shown. Block 402 determines the phase error direction using, e.g., a bang-bang PFD that generates a one-bit early/late signal. Block 404 generates a sigma-delta error prediction by, e.g., finding the difference between a current division value N and a division ratio and integrating. Block 406 determines whether the direction of the prediction agrees with the determined phase error direction. If so, then block 410 makes no phase error change and processing returns to block 402 to determine the phase error in the next cycle. If the prediction does not agree, then the phase error of the PLL is greater than the predicted sigma-delta error. Block 412 uses the predicted sigma-delta error to adjust the phase correction before processing returns to block 402 for the next cycle.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 5:
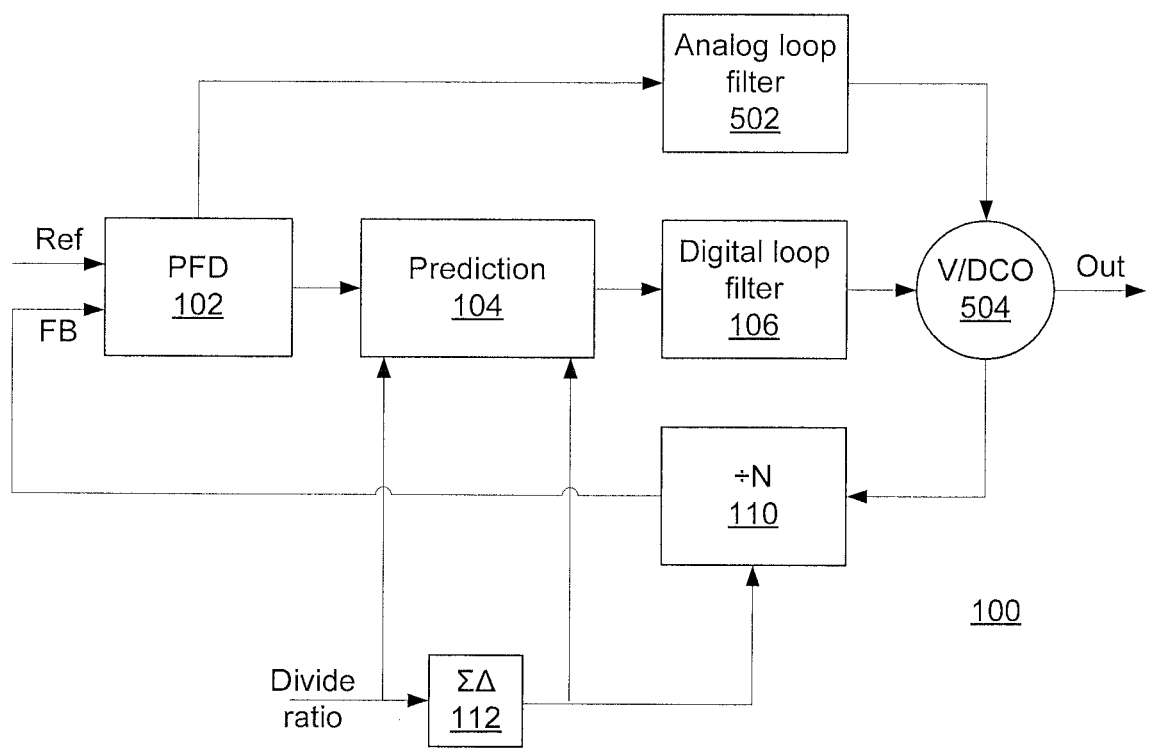
FIG. 5 is a block diagram of a bang-bang hybrid fractional-N phase-locked loop with a phase error prediction module in accordance with the present principles.

Referring now to FIG. 5, a hybrid analog/digital fractional-N PLL 500 is shown. The general form of the hybrid PLL 500 follows that of the purely digital PLL 100 shown above, but includes an analog control path as well. The PFD 102 provides its early/late output to an analog loop filter 502, which is used as a control to a voltage/digitally controlled oscillator 504.

In a hybrid PLL 500, a linear analog proportional path control is combined with the bang-bang digital integral path control described above. The linearity and low latency of the analog proportional path helps further resolve noise sensitivity in the bang-bang PLL. The digital integral path, meanwhile, keeps the PLL small, programmable, and scalable.

Having described preferred embodiments of a prediction based digital control for fractional-N PLLs (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A fractional-N digital phase-locked loop (PLL), comprising:
   a bang-bang phase frequency detector, configured to output an early/late signal based on a reference signal and a feedback signal;
   a prediction module, configured to generate a predicted phase error based on a sigma-delta error and to output a phase error correction if the predicted phase error disagrees with the early/late signal;
   a digitally controlled oscillator (DCO), configured to output a phase-corrected multiple of the reference signal based on the reference signal and the output of the prediction module;
   an integer divider, configured to divide in frequency the output of the digitally controlled oscillator by an integer value N; and
   a sigma-delta module, configured to change the integer value N in accordance with a non-integer divide ratio.

2. The PLL of claim 1, wherein the prediction module comprises an integrator configured to integrate an instantaneous frequency error.

3. The PLL of claim 2, wherein the instantaneous frequency error is calculated as a difference between the integer value N for a given cycle and the divide ratio.

4. The PLL of claim 2, wherein the integrator is lossy, such that DC components of an integrator output are removed.

5. The PLL of claim 2, wherein the prediction module is further configured to compare a sign of an integrator output with early/late signal from the bang-bang phase frequency detector to determine agreement.

6. The PLL of claim 5, wherein the prediction module is further configured to output the integrator output if there is no agreement and to output zero if there is agreement.

7. The PLL of claim 6, wherein the DCO is further configured to change a phase correction for the DCO output by an amount that is proportional to the output of the integrator.

8. The PLL of claim 1, further comprising a digital loop filter that filters the output of the prediction module before that output reaches the DCO.

9. A fractional-N hybrid phase-locked loop (PLL), comprising:
   a bang-bang phase frequency detector, configured to output an early/late signal based on a reference signal and a feedback signal;
   a prediction module, configured to generate a predicted phase error based on a sigma-delta error and to output a phase error correction if the predicted phase error disagrees with the early/late signal;
   a voltage/digitally controlled oscillator (V/DCO), configured to output a phase-corrected multiple of the reference signal based on the reference signal, the output of the prediction module, and an analog output of the phase frequency detector;
   an integer divider, configured to divide in frequency the output of the digitally controlled oscillator by an integer value N;
   a sigma-delta module, configured to change the integer value N in accordance with a non-integer divide ratio.

10. The PLL of claim 9, wherein the prediction module comprises an integrator configured to integrate an instantaneous frequency error.

11. The PLL of claim 10, wherein the prediction module is further configured to compare a sign of an integrator output with early/late signal from the bang-bang phase frequency detector to determine agreement.

12. The PLL of claim 11, wherein the prediction module is further configured to output the integrator output if there is no agreement and to output zero if there is agreement.

13. The PLL of claim 12, wherein the DCO is further configured to change a phase correction for the DCO output by an amount that is proportional to the output of the integrator.

14. A method for phase correction, comprising:
   determining a phase error direction;
   generating a prediction for the phase error based on a sigma-delta error using a processor;
   determining whether the prediction agrees with the determined phase error direction; and
   if the prediction does not agree, adjusting a phase correction in accordance with the predicted phase error.

15. The method of claim 14, wherein generating a prediction for the phase error comprises calculating an instantaneous frequency error based on a difference between a present divider value N and a target divide ratio.

16. The method of claim 15, wherein generating a prediction for the phase error further comprises integrating the instantaneous frequency error to produce a predicted phase error.

17. The method of claim 16, wherein integrating the instantaneous frequency error is a lossy integration, such that DC components of the prediction are removed.

18. The method of claim 16, wherein determining whether the prediction agrees comprises comparing a sign of the predicted phase error to the phase error direction.

19. The method of claim 18, wherein adjusting the phase correction comprises changing the phase correction by an amount that is proportional to the predicted phase error.

* * * * *